(12) United States Patent
Kuehl et al.

(10) Patent No.: US 8,368,519 B2
(45) Date of Patent: Feb. 5, 2013

(54) PACKAGING A SEMICONDUCTOR WAFER

(75) Inventors: Hartmut Kuehl, Gau-Bischofsheim (DE); Joerg Weyerhaeuser, Grolsheim (DE); Johannes Windeln, Bodenheim (DE)

(73) Assignee: International Business Machines Corporation, Armonk, NY (US)

( * ) Notice: Subject to any disclaimer, the term of this patent is extended or adjusted under 35 U.S.C. 154(b) by 1154 days.

(21) Appl. No.: 12/248,193

(22) Filed: Oct. 9, 2008

(65) Prior Publication Data

US 2009/0096589 A1 Apr. 16, 2009

(30) Foreign Application Priority Data

Oct. 10, 2007 (EP) .................................... 07118176

(51) Int. Cl.
*H04Q 5/22* (2006.01)

(52) U.S. Cl. ...... 340/10.52; 340/10.1; 438/15; 438/106; 438/107

(58) Field of Classification Search ............... 340/10.52, 340/10.1; 438/15, 106, 107; 257/531, 777, 257/723; 428/141, 64.4; 235/492; 216/540; 425/150

See application file for complete search history.

(56) References Cited

U.S. PATENT DOCUMENTS

| | | | |
|---|---|---|---|
| 6,003,757 A * | 12/1999 | Beaumont et al. ............ 228/246 |
| 6,236,223 B1 * | 5/2001 | Brady et al. ................ 324/750.3 |
| 6,566,745 B1 * | 5/2003 | Beyne et al. .................. 257/680 |
| 7,070,087 B2 * | 7/2006 | Brouillette et al. ............ 228/246 |
| 7,619,346 B2 * | 11/2009 | Yazdi ............................ 310/307 |
| 7,815,424 B2 * | 10/2010 | Nakamura et al. ............ 425/150 |
| 2002/0125402 A1 * | 9/2002 | Cordes et al. .................. 249/119 |
| 2002/0125546 A1 * | 9/2002 | Muta .............................. 257/531 |
| 2004/0214420 A1 * | 10/2004 | Brouillette et al. ........... 438/616 |
| 2006/0071795 A1 * | 4/2006 | Benedikt ..................... 340/572.7 |
| 2006/0124752 A1 * | 6/2006 | Posamentier ................. 235/492 |
| 2006/0157444 A1 * | 7/2006 | Nakamura et al. .............. 216/54 |
| 2006/0223225 A1 * | 10/2006 | Arneson et al. ............... 438/106 |
| 2007/0194430 A1 * | 8/2007 | Lin et al. ....................... 257/690 |
| 2007/0200248 A1 * | 8/2007 | Ong ............................... 257/777 |
| 2008/0057258 A1 * | 3/2008 | Kanno et al. ................. 428/64.4 |
| 2008/0156849 A1 * | 7/2008 | Bouchard et al. ............ 228/125 |
| 2009/0057885 A1 * | 3/2009 | Theuss .......................... 257/723 |
| 2009/0096589 A1 * | 4/2009 | Kuehl et al. ................. 340/10.52 |
| 2009/0304992 A1 * | 12/2009 | Desimone et al. ............ 428/141 |
| 2010/0029045 A1 * | 2/2010 | Ramanathan et al. ........ 438/114 |
| 2010/0148397 A1 * | 6/2010 | Nakamura et al. ............ 264/293 |
| 2010/0193935 A1 * | 8/2010 | Lachner et al. ............... 257/693 |
| 2011/0046008 A1 * | 2/2011 | Love et al. ......................... 506/9 |
| 2012/0104574 A1 * | 5/2012 | Boeck et al. .................. 257/660 |
| 2012/0142144 A1 * | 6/2012 | Taheri ........................... 438/107 |

* cited by examiner

*Primary Examiner* — Hoi Lau

(74) *Attorney, Agent, or Firm* — Kolisch Hartwell, PC; Steven L. Bennett

(57) ABSTRACT

Embodiments embed at least one Radio Frequency Identification (RFID) tag into the mold. The mold may comprise a cavity adapted to the geometrical form of the RFID tag. In some embodiments, the cavity is marginally bigger than the RFID tag. In many embodiments, the cavity with the embedded the RFID tag is covered by glue. Thus, the mold, the RFID tag and the glue may be suitable for temperatures up to, e.g., 400° C. Further the mold and the glue may be resistant to concentrated sulfuric acid and formic acid. The serial number of the mold may be stored in the RFID tag. The RFID tag may detect characteristic data during the transfer of the solder from the mold to the wafer. In one embodiment, the RFID tag may detect the temperature. In another embodiment, a plurality of RFID tags may detect various temperatures for controlling the packaging process.

20 Claims, 4 Drawing Sheets

PACKAGING A SEMICONDUCTOR WAFER

CROSS-REFERENCE TO RELATED APPLICATION

This application, in accordance with 35 USC §119, claims priority to and is a national stage application for European Patent Application No. 07118176.2, entitled "A method and a tool system for packaging a semiconductor wafer", attorney docket number DE9-2007-0067-EP1, filed Oct. 10, 2007, the disclosure of which is incorporated herein in its entirety for all purposes.

BACKGROUND

The present disclosure relates to semiconductor wafer packaging technologies. More specifically, the present disclosure relates to a method and a tool system for packaging a semiconductor wafer.

For the manufacturing of a semiconductor chip, referred to as "Controlled Collapse Chip Connection New Process" (C4NP), is used for packaging a wafer. In a mold, the wafer and a solder are heated to apply electric contacts on the surface of the wafer. When the wafer and the solder are heated in the mold, the solder transfers to the wafer and forms the electric contacts. The solder may comprise, e.g., copper, tin and/or silver. The solder contains no lead. After a cleaning process, the mold can be used again and has a serial number to identify the source of the semiconductor chip. However, in the known C4NP, the serial number of the actual mold is illegible after a cleaning process.

BRIEF SUMMARY

One embodiment provides a method for packaging a wafer. The method involves filling a mold with a solder, wherein the mold comprises at least one integrated Radio Frequency Identification (RFID) tag; loading the mold with the wafer into a solder transfer tool in response to filling the mold with the solder; heating the wafer and the mold to transfer the solder from the mold to the wafer; and detecting, by the RFID tag, characteristic data during transference of the solder from the mold to the wafer to control packaging the wafer.

Another embodiment comprises a tool system for packaging a wafer comprising a mold for receiving a solder and a wafer; an Radio Frequency Identification (RFID) tag inserted in a cavity within the mold, wherein the RFID tag is provided to detect characteristic data during transference of the solder from the mold to the wafer to control packaging the wafer; and a glue coupled with the mold and the RFID tag.

A further embodiment comprises a computer program product for packaging a wafer. The computer program product comprises a computer usable medium having computer usable program code embodied therewith, the computer usable program code comprises computer usable program code configured to perform operations. The operations may involve filling a mold with a solder, wherein the mold comprises at least one integrated Radio Frequency Identification (RFID) tag; loading the mold with the wafer into a solder transfer tool in response to filling the mold with the solder; heating the wafer and the mold to transfer the solder from the mold to the wafer; and recording characteristic data, detected by the RFID tag during transference of the solder from the mold to the wafer, to control packaging the wafer.

DETAILED DESCRIPTION

The following is a detailed description of novel embodiments depicted in the accompanying drawings. However, the amount of detail offered is not intended to limit anticipated variations of the described embodiments; on the contrary, the claims and detailed description are to cover all modifications, equivalents, and alternatives falling within the spirit and scope of the present teachings as defined by the appended claims. The detailed descriptions below are designed to make such embodiments understandable to a person having ordinary skill in the art.

Generally, a method and a tool system for packaging a semiconductor wafer are described herein. Embodiments embed at least one Radio Frequency Identification (RFID) tag into the mold. The mold may comprise a cavity adapted to the geometrical form of the RFID tag. In some embodiments, the cavity is marginally bigger than the RFID tag. For example, the cavity may be created by a sandblast process. A specific grain diameter may be provided for the sandblast process to achieve the mechanical integrity and the adhesive properties.

In many embodiments, the cavity with the embedded the RFID tag is covered by glue. In particular, the glue may comprise alkali-hexa-fluorosilicates and waterglass. Thus, the mold, the RFID tag, and the glue may be suitable for temperatures up to, e.g., 400° C. Furthermore, the mold and the glue may be resistant to concentrated sulfuric acid and formic acid.

In some embodiments, the serial number of the mold may be stored in the RFID tag. In several embodiments, the RFID tag may comprise only passive electronic elements. And, in further embodiments, the RFID tag may comprise neither active electronic elements nor any optical elements.

The RFID tag may detect characteristic data during the transfer of the solder from the mold to the wafer. In particular, the RFID tag may detect the temperature. The detected characteristic data may be used for controlling the packaging process.

In one embodiment, the RFID tag may detect the temperature during the transfer of the solder from the mold to the wafer. The detected values may be used for controlling the packaging process. This limits temperature variations to achieve the desired crystalline structure of the finished solder bump. The crystalline structure can guarantee the mechanical properties of the solder bump.

While some of the specific embodiments described below reference embodiments with specific configurations, those of skill in the art will realize that embodiments of the present disclosure may advantageously be implemented with other configurations with similar issues or problems.

Figure 1:
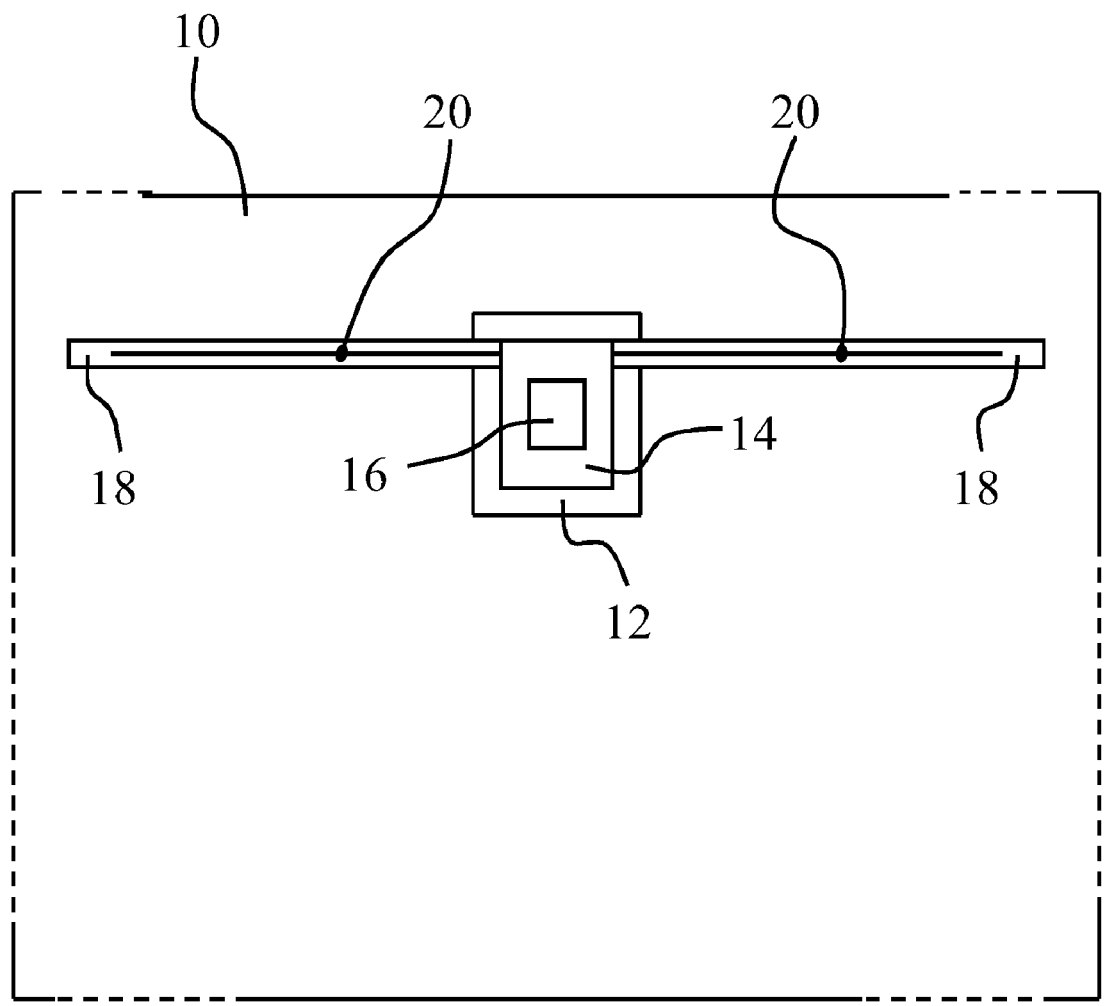
FIG. 1 illustrates a detail of a bottom view of an embodiment of a mold with an embedded RFID tag for performing the solder transfer process.

With reference now to FIG. 1, which depicts a detail of a bottom view for an embodiment of mold 10 with an embedded RFID tag for performing a solder transfer process. FIG. 1 shows that part of the mold 10 where the RFID tag is embedded. The dotted lines indicate that the mold is substantial larger than the RFID tag.

The mold 10 may be made of a borofloat glass and formed as a rectangular panel. The borofloat glass includes borosilicate glass. In this example, the panel of the mold 10 has a thickness of 2 mm.

In a defined portion of the mold 10, there is a first cavity 12. The first cavity 12 has a block-shaped form and is provided for a tag housing 14. The tag housing 14 is marginally smaller than the first cavity 12 and is arranged in the center of the first cavity 12. A surface acoustic wave (SAW) crystal 16 is arranged inside the tag housing 14. The SAW tag contains only passive electronic elements.

The mold 10 comprises a second cavity 18. The second cavity 18 may be formed like a channel. The center portion of the second cavity 18 penetrates the first cavity 12 and provides for two antenna wires 20. The antenna wires 20 extend from two opposite sides of the tag housing 14 into two diametrical directions. The antenna wires 20 form an electric dipole antenna.

In some embodiments, the first cavity 12 may have a length of 15 mm, a width of 7 mm, and a height of 1.2 mm. The tag housing 14 may have a length of 9 mm, a width of 5 mm, and a height of 0.85 mm. The second cavity 18 may have a length of 100 mm, a width of 2 mm, and a height of 0.7 mm. The antenna wires 20 have a length of 35 mm. Depending on final technical requirements and optimization, these dimensions can vary.

A sandblast process, for example, may create the cavities 12 and 18. A specific grain diameter is provided for the sandblast process to achieve the mechanical integrity and the adhesive properties. A specific glue may cover the cavities 12 and 18 with the tag housing 14 and the antenna wire 20, respectively. Alternatively, the tag housing 14 and the antenna wire 20 may be fixed within the cavities 12 and 18, respectively, wherein one side of the cavities 12 and 18 stays open.

According to one embodiment, the tag housing 14 and the antenna wires 20 may be embedded in the cavities 12 and 18, respectively, of the mold 10 and covered with the specific glue.

Alternatively, the tag housing 14 and the antenna wires 20 may be fixed in the cavities 12 and 18, respectively, but not covered with the glue. The glue may have temperature stability up to approximately 400° C. during the solder process. The glue may comprise alkali-hexa-fluorosilicates and waterglass. The embedded tag housing 14 and the antenna wires 20 may be compatible with very aggressive chemicals, such as strong acids. The glue may ensure a durable bonding between the mold 10 and the tag housing 14.

The tag housing 14 and the antenna wires 20 form an RFID tag. The RFID tag is provided for controlling a part of a C4NP process. The RFID tag can identify the mold 10, measure the temperatures without any visual contact, and transmit the data for use in a closed loop control to increase the yield of a solder transfer process, which is a part of the C4NP process.

Figure 2:
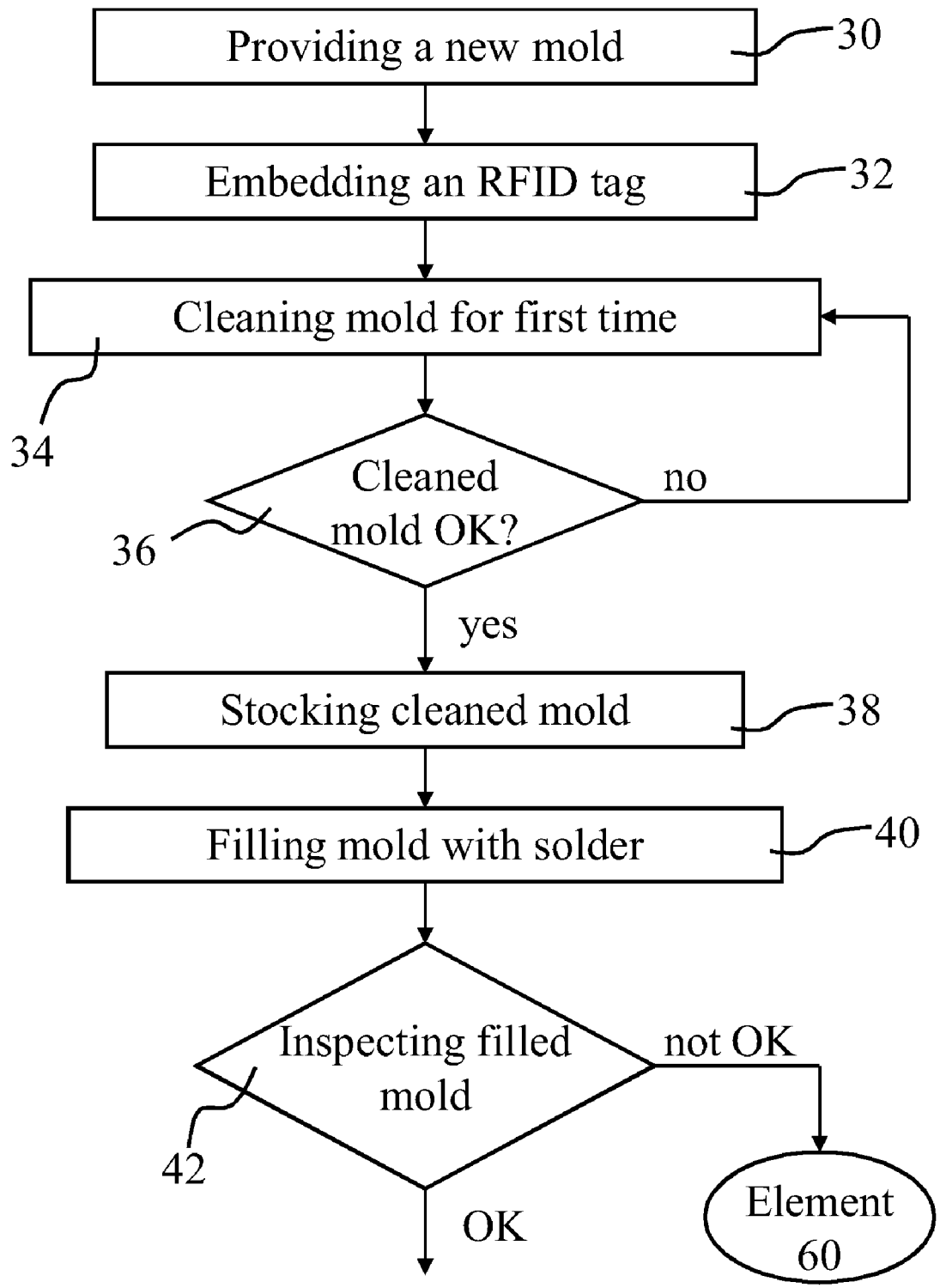
FIG. 2 illustrates a flowchart diagram of a first part of an embodiment of a method for performing a solder transfer process.
Figure 3:
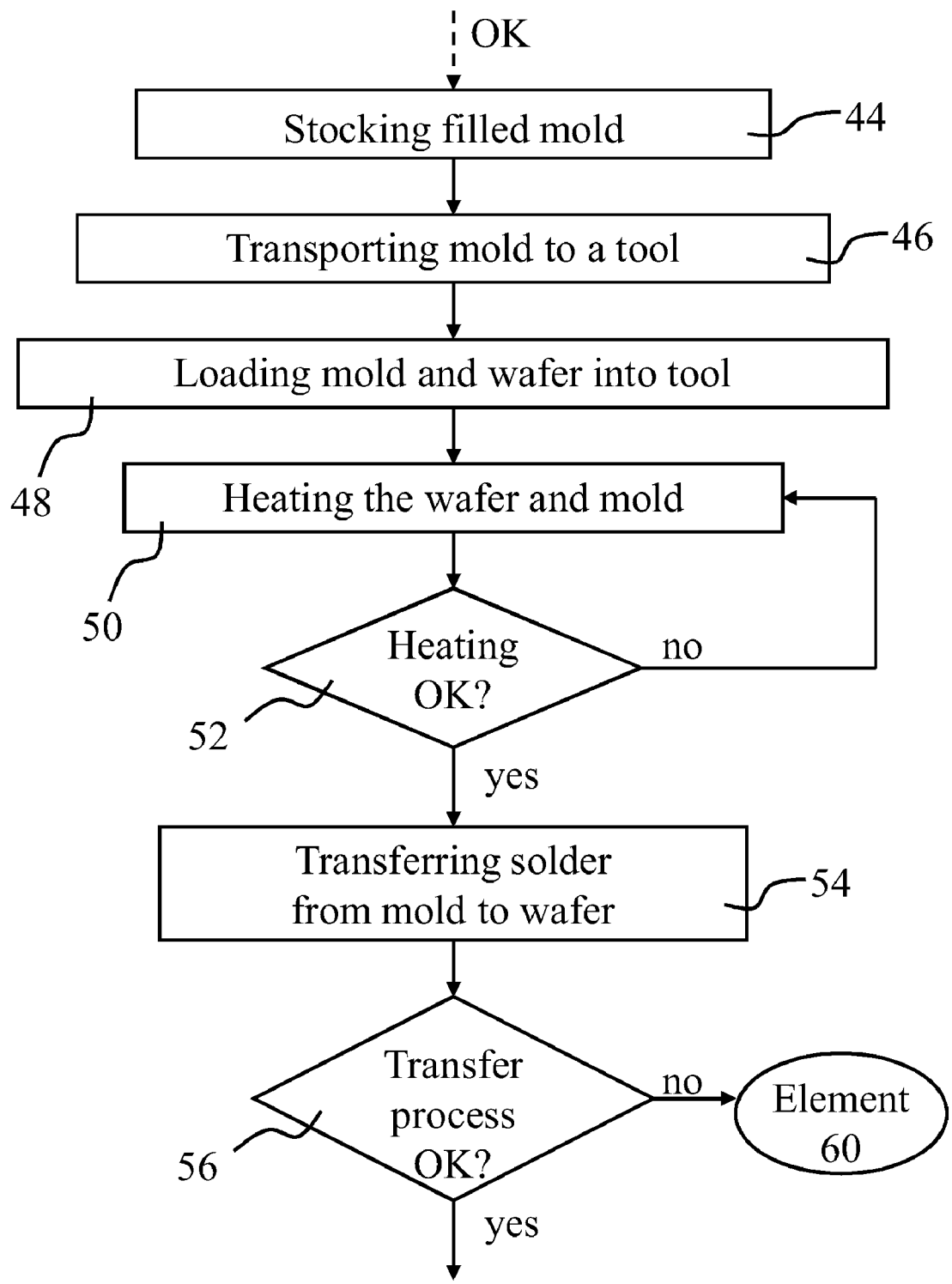
FIG. 3 illustrates a flowchart diagram of a second part of an embodiment of the method for performing the solder transfer process.
Figure 4:
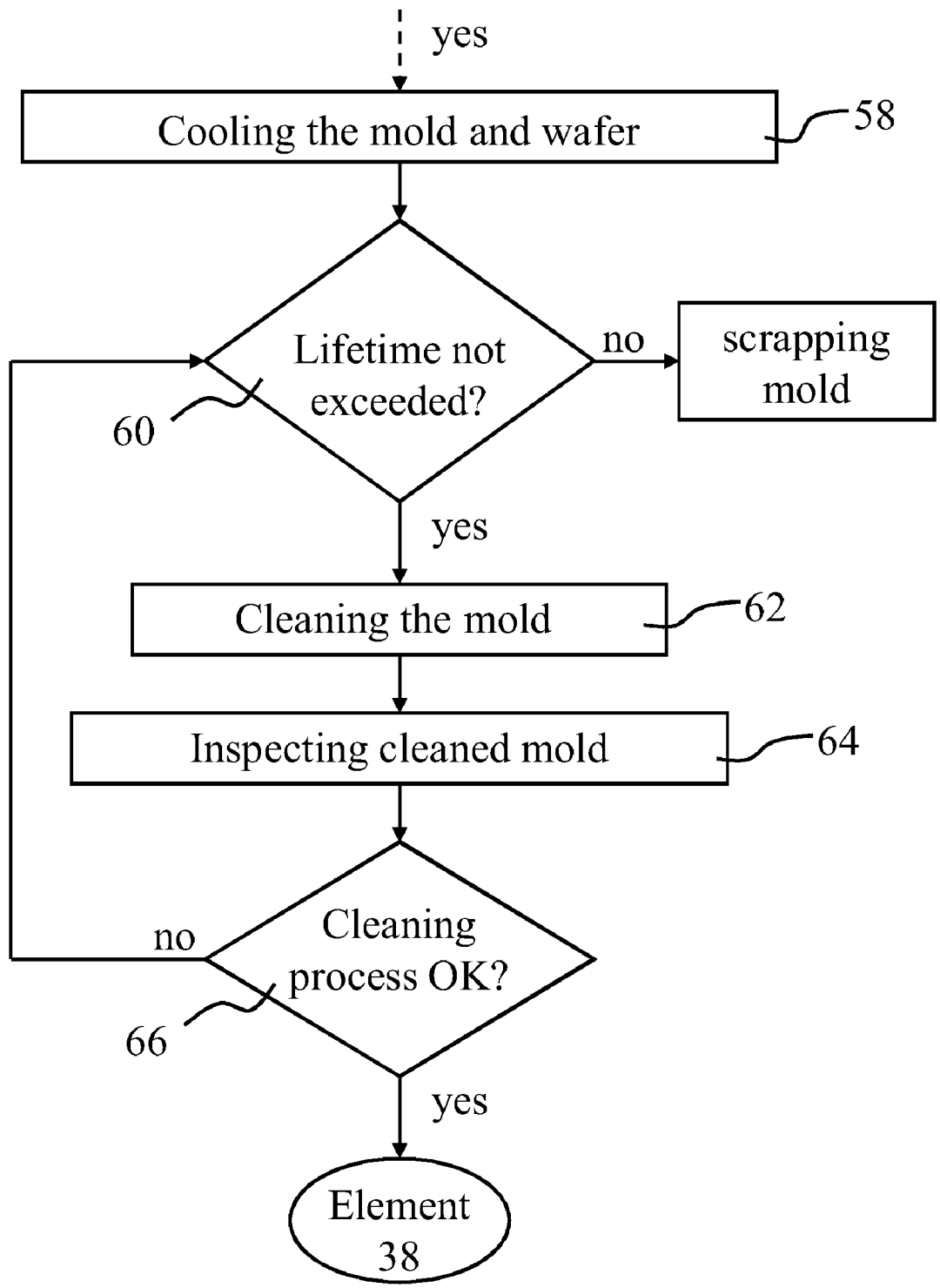
FIG. 4 illustrates a flowchart diagram of a third part of an embodiment of the method for performing the solder transfer process.

FIG. 2 illustrates a flowchart diagram for an embodiment of a first part of a method for performing a solder transfer process. The first element 30 provides the new mold 10. Element 32 embeds the RFID tag into the mold. The RFID tag may have been programmed during manufacturing. The product number and/or the serial number of the mold 10 may be stored in the RFID tag. Further, temperature settings of the RFID tag may be calibrated. Element 34 cleans the mold 10 for the first time. The cleaning process may prepare the mold for usage. The temperature values can be verified during the cleaning process to ensure proper cleaning results.

Then, element 36 inspects the cleaned mold 10. If the cleaned mold 10 fails to pass inspection, or is not okay (OK), then the cleaning process according to element 34 is repeated or set forth. If the cleaned mold 10 passes inspection, or is OK, then element 38 stocks the cleaned mold 10. While stocking the mold 10 in the element 38, the RFID tag may be used to identify stocked molds 10 without a direct visual contact.

Element 40 fills the mold 10 with solder. The RFID tag may be used to record the identity of the mold. Furthermore, the RFID tag may be used to record the starting and stopping time and the date of filling the mold 10 with solder. Additionally, the RFID tag may sense the process temperature and distribution and transmit this data for recording. Element 42 inspects the filled mold 10. If the filled mold 10 is not OK, then the procedure jumps to element 60. Element 60 checks whether the lifetime was exceeded.

If the filled mold 10 is OK, then element 44 stocks the filled mold 10. The RFID tag can be used to register the mold 10 for storage. Element 46 transports the filled mold 10 to a solder transfer tool. The RFID tag may be used to ensure that only correct and inspected, filled molds 10 are used. Additionally, the RFID tag may be used to ensure that the lifetime of the molds 10 are not exceeded.

Element 48 loads the filled mold 10 and a wafer into the solder transfer tool. A tool internal tag reader verifies that a correct and filled mold is loaded. Then element 50 heats the wafer and the mold 10. The RFID tag verifies whether the required temperature and distribution for the specific solder type is OK.

Element 52 inspects the heating process. If the mold 10 and the wafer are not sufficiently hot, or not heated up OK, then the procedure goes back to element 50. If the mold 10 and the wafer are heated up OK, then the solder is transferred from the mold 10 to the wafer at element 54.

Element 56 inspects the transfer process. If the transfer process is not OK, then the procedure jumps to element 60. If the transfer process is OK, then the mold 10 and the wafer are cooled down at element 58. The RFID tag is used to verify that the required temperature profile and distribution is achieved.

Element 60 checks whether or not the lifetime has been exceeded. If the lifetime has been exceeded, then the mold 10 is scrapped. If the lifetime has not yet been exceeded, then the mold 10 is cleaned again at element 62. The RFID tag may be used to verify whether the cleaning process achieves the required temperature and distribution for a successful cleaning process.

Element 64 inspects the cleaned mold 10. The RFID tag may be used to record that the mold is properly cleaned and inspected. Element 66 checks the cleaning process. If the cleaning process is not OK, then element 60 is performed again. If the cleaning process is OK, then the mold 10 can be stocked again at element 38.

The above procedures discuss the use of one RFID tag for the most part. In further embodiments, the mold 10 may comprise a plurality of RFID tags for use by the procedures.

Embodiments can also be embedded in a computer program product, which may comprise all the features enabling the implementation of the methods described herein. Further, when loaded in computer system, said computer program product is able to carry out these methods.

Although illustrative embodiments have been described herein with reference to the accompanying drawings, it is to be understood that embodiments are not limited to those precise embodiments, and that various other changes and modifications may be performed therein by one skilled in the art without departing from the scope or spirit of the invention. All such changes and modifications are intended to be included within the scope of the invention as defined by the appended claims.

LIST OF REFERENCE NUMERALS 10 mold
12 first cavity
14 tag housing
16 surface acoustic wave crystal
18 second cavity
20 antenna wire
30 providing the new mold
32 embedding an RFID tag
34 cleaning the mold for the first time
36 inspecting the cleaned mold
38 stocking the cleaned mold
40 filling the mold with solder
42 inspecting the filled mold
44 stocking the filled mold
46 transporting the mold to a solder transfer tool
48 loading the mold and the wafer into the tool
50 heating the wafer and the mold
52 inspecting the heating process
54 transferring the solder from the mold to the wafer
56 inspecting the transfer process
58 cooling the mold and the wafer
60 checking the lifetime
62 cleaning the mold
64 inspecting the cleaned mold
66 checking if the cleaning process is OK

What is claimed is:

1. A method for packaging a wafer, the method comprising:
   filling a mold with a solder, wherein the mold comprises at least one integrated Radio Frequency Identification (RFID) tag;
   loading the mold with the wafer into a solder transfer tool in response to filling the mold with the solder;
   heating the wafer and the mold to transfer the solder from the mold to the wafer; and
   detecting, by the RFID tag, characteristic data during transference of the solder from the mold to the wafer to control packaging the wafer.

2. The method of claim 1, further comprising storing a serial number of the mold in the RFID tag during manufacturing of the RFID tag.

3. The method of claim 1, further comprising stocking the mold in response to filling the mold with the solder and identifying the mold via the RFID tag in response to stocking the mold.

4. The method of claim 1, further comprising cooling the wafer and the mold, after heating up the wafer and the mold, and detecting the characteristic data via the RFID tag during the cooling of the wafer and the mold.

5. The method of claim 1, wherein filling the mold comprises filling the mold that comprises a plurality of integrated RFID tags.

6. The method of claim 1, wherein detecting, by the RFID tag, the characteristic data comprises detecting temperature values of the mold, the RFID tag, the wafer or a glue, wherein the glue couples the wafer and the mold.

7. The method of claim 6, further comprising controlling the packaging of the wafer based upon the temperature values.

8. A system for packaging a wafer, the system comprising:
   a mold for receiving a solder and a wafer;
   an Radio Frequency Identification (RFID) tag inserted in a cavity within the mold, wherein the RFID tag is provided to detect characteristic data during transference of the solder from the mold to the wafer to control packaging the wafer; and
   a glue coupled with the mold and the RFID tag.

9. The system of claim 8, wherein the mold comprises a cavity created via a sandblast process.

10. The system of claim 8, wherein the mold comprises a borofloat glass.

11. The system of claim 10, wherein the borofloat glass comprises a borosilicate glass.

12. The system of claim 8, wherein the RFID tag comprises passive electronic elements.

13. The system of claim 12, wherein the RFID tag detects temperature values to transmit to control packaging the wafer.

14. The system of claim 8, wherein the glue comprises alkali-hexa-fluorosilicates.

15. The system of claim 8, wherein the glue comprises waterglass.

16. The system of claim 8, comprising hardware or a combination of hardware and software.

17. A computer program product for packaging a wafer, the computer program product comprising; a computer usable medium having computer usable program code embodied therewith, the computer usable program code comprising:
   computer usable program code configured to control the computer program product to perform operations, comprising:
   filling a mold with a solder, wherein the mold comprises at least one integrated Radio Frequency Identification (RFID) tag;
   loading the mold with the wafer into a solder transfer tool in response to filling the mold with the solder;
   heating the wafer and the mold to transfer the solder from the mold to the wafer; and
   recording characteristic data, detected by the RFID tag during transference of the solder from the mold to the wafer, to control packaging the wafer.

18. The computer program product of claim 17, wherein the operations further comprise controlling the packaging of the wafer based upon the characteristic data, wherein the characteristic data comprises temperature value of the mold, the RFID tag, the wafer and/or a glue, wherein the glue bonds the wafer to the mold and/or covers the wafer in the mold.

19. The computer program product of claim 17, wherein the operations further comprise stocking the mold in response to filling the mold with the solder and identifying the mold via the RFID tag in response to stocking the mold.

20. The computer program product of claim 17, wherein the operations further comprise cooling the wafer and the mold, after heating the wafer and the mold, and recording the characteristic data from the RFID tag while cooling the wafer and the mold.

* * * * *